US010255396B2

(12) United States Patent
Bouzouzou et al.

(10) Patent No.: US 10,255,396 B2
(45) Date of Patent: Apr. 9, 2019

(54) GRAPHICAL ANALYSIS OF COMPLEX CLOCK TREES

(71) Applicant: Mentor Graphics Corporation, Wilsonville, OR (US)

(72) Inventors: Hamid Bouzouzou, Montbonnot-Saint-Martin (FR); Pierre-Olivier Ribet, Montbonnot-Saint-Martin (FR); Daniel Blanks, Fremont, CA (US); Patrick Richier, Montbonnot-Saint-Martin (FR); Laurent Masse-Navette, Montbonnot-Saint-Martin (FR)

(73) Assignee: Mentor Graphics Corporation, Wilsonville, OR (US)

( * ) Notice: Subject to any disclaimer, the term of this patent is extended or adjusted under 35 U.S.C. 154(b) by 1 day.

(21) Appl. No.: 15/482,306

(22) Filed: Apr. 7, 2017

(65) Prior Publication Data

US 2017/0293706 A1    Oct. 12, 2017

Related U.S. Application Data

(60) Provisional application No. 62/319,729, filed on Apr. 7, 2016.

(51) Int. Cl.
*G06F 17/50*    (2006.01)

(52) U.S. Cl.
CPC ........ *G06F 17/5031* (2013.01); *G06F 17/505* (2013.01); *G06F 2217/62* (2013.01)

(58) Field of Classification Search
USPC ........................................... 716/113
See application file for complete search history.

(56) References Cited

U.S. PATENT DOCUMENTS

| 2007/0220473 | A1* | 9/2007 | Goto | G06F 17/5068 716/113 |
|---|---|---|---|---|
| 2014/0306746 | A1* | 10/2014 | Meneghini | G01R 31/31725 327/291 |
| 2014/0332979 | A1* | 11/2014 | Cicalo | H01L 23/481 257/774 |
| 2017/0004249 | A1* | 1/2017 | Feng | G06F 17/5081 |
| 2017/0293706 | A1* | 10/2017 | Bouzouzou | G06F 17/5031 |

* cited by examiner

*Primary Examiner* — Mohammed Alam
(74) *Attorney, Agent, or Firm* — Mentor Graphics Corporation

(57) ABSTRACT

This application discloses a computing system to implement a place and route tool to synthesize a clock tree in a layout design of an integrated circuit based on timing constraints for the integrated circuit. The computing system can select a portion of the clock tree to present in a schematic connectivity presentation based on a conformance of the portion of the clock tree to timing constraints for the clock tree. The computing system can compress the other portions of the clock tree into the compacted representation based on the selection of the portion of the clock tree. The compacted representation can retain a hierarchical connectivity of the other portions of the clock tree. The computing system can generate the schematic connectivity presentation of the clock tree that includes the selected portion of the clock tree coupled to at least one compacted representation of other portions of the clock tree.

17 Claims, 6 Drawing Sheets

GRAPHICAL ANALYSIS OF COMPLEX CLOCK TREES

RELATED APPLICATION

This application claims priority and benefit of U.S. Provisional Patent Application No. 62/319,729, filed, Apr. 7, 2016, which is incorporated by reference herein in its entirety.

TECHNICAL FIELD

This application is generally related to electronic design automation and, more specifically, to multi-modal multi-corner graphical analysis of complex clock trees.

BACKGROUND

Designing and fabricating electronic systems typically involves many steps, known as a design flow. The particular steps of a design flow often are dependent upon the type of electronic system being designed, its complexity, the design team, and the fabricator or foundry that will manufacture the electronic system. The design flow typically starts with a specification for a new electronic system, which can be transformed into a logical design. The logical design can model the electronic system at a register transfer level (RTL), which is usually coded in a Hardware Design Language (HDL), such as System Verilog, Very high speed integrated circuit Hardware Design Language (VHDL), System C, or the like. The logical design of the electronic system can be analyzed to confirm that it will accurately perform the functions desired for the electronic system. This analysis is sometimes referred to as "functional verification."

After the accuracy of the logical design is confirmed, it can be converted into a device design by synthesis software. The device design, which is typically in the form of a schematic or netlist, describes the specific components, such as transistors, resistors, and capacitors, which can be used in the electronic system, along with their interconnections. This device design generally corresponds to the level of representation displayed in conventional circuit diagrams.

A designer, for example, using a place-and-route tool, can place portions of the device design relative to each other in a geographic design environment. While these device design portions can correspond to segments of code in a hardware description language, they typically are shown in the geographic design environment as blocks representing components of the electrical system. Once the blocks have been placed relative to each other, wiring lines can be routed between the blocks. These wiring lines represent the interconnections, such as data signal interconnections and clock signal interconnections, which can be formed between the components of the electrical system.

These clock signal interconnections, often referred to as a clock tree, are typically synthesized by the place-and-route tool based on manually-defined timing constraints for the device design. A static timing analysis tool can analyze the synthesized clock tree to determine clock signal delay at each node in the clock tree of the device design in the geographic design environment. When the clock signal delays fall outside of timing requirements of the device design, often called a timing violation, the designer can identify portions of the clock tree causing the timing violation and modify timing constraints utilized to synthesize the clock tree. This process of synthesizing the clock tree based on timing constraints, performing static timing analysis on the synthesized clock tree, and, when there is a timing violation, revising the timing constraints can be performed iteratively in an attempt to generate a clock tree without timing violations.

While much of the design effort to remedy the presence of a timing violation in a synthesized clock tree is manual, the place-and-route tool can provide textual reports and present a table representation of the clock tree for use by a designer to identify portions of the clock tree causing the timing violation. These table representations of the clock tree often include icons corresponding to nodes in the clock tree that, when selected, can expand to identify upstream or downstream clock tree nodes, allowing the designer to review discrete branches in clock tree. Many modern clock trees, however, have complex structures, for example, including clock loops, clock convergence nodes, or the like, which are obfuscated in the table representation.

SUMMARY

This application discloses tools or mechanisms, for example, implemented in a computing system, to perform graphical analysis of complex clock trees. For example, the computing system can implement a place and route tool to synthesize a clock tree in a layout design of an integrated circuit based on timing constraints for the integrated circuit. The computing system can select a portion of the clock tree to present in a schematic connectivity presentation based on a conformance of the portion of the clock tree to timing constraints for the clock tree. The computing system can compress the other portions of the clock tree into the compacted representation based on the selection of the portion of the clock tree. The compacted representation can retain a hierarchical connectivity of the other portions of the clock tree. The computing system can generate the schematic connectivity presentation of the clock tree that includes the selected portion of the clock tree coupled to at least one compacted representation of other portions of the clock tree. Embodiments will be described below in greater detail.

DETAILED DESCRIPTION

Illustrative Operating Environment

Figure 1:
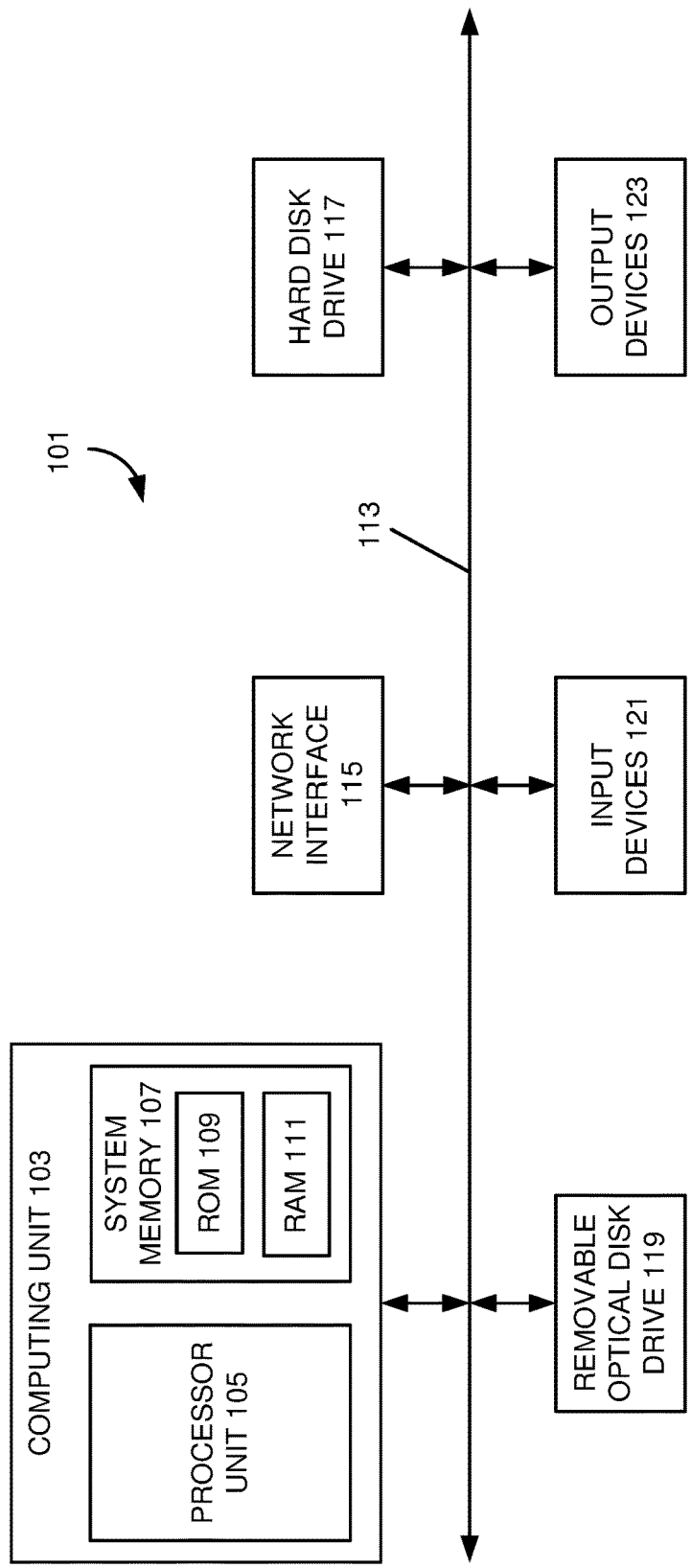
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
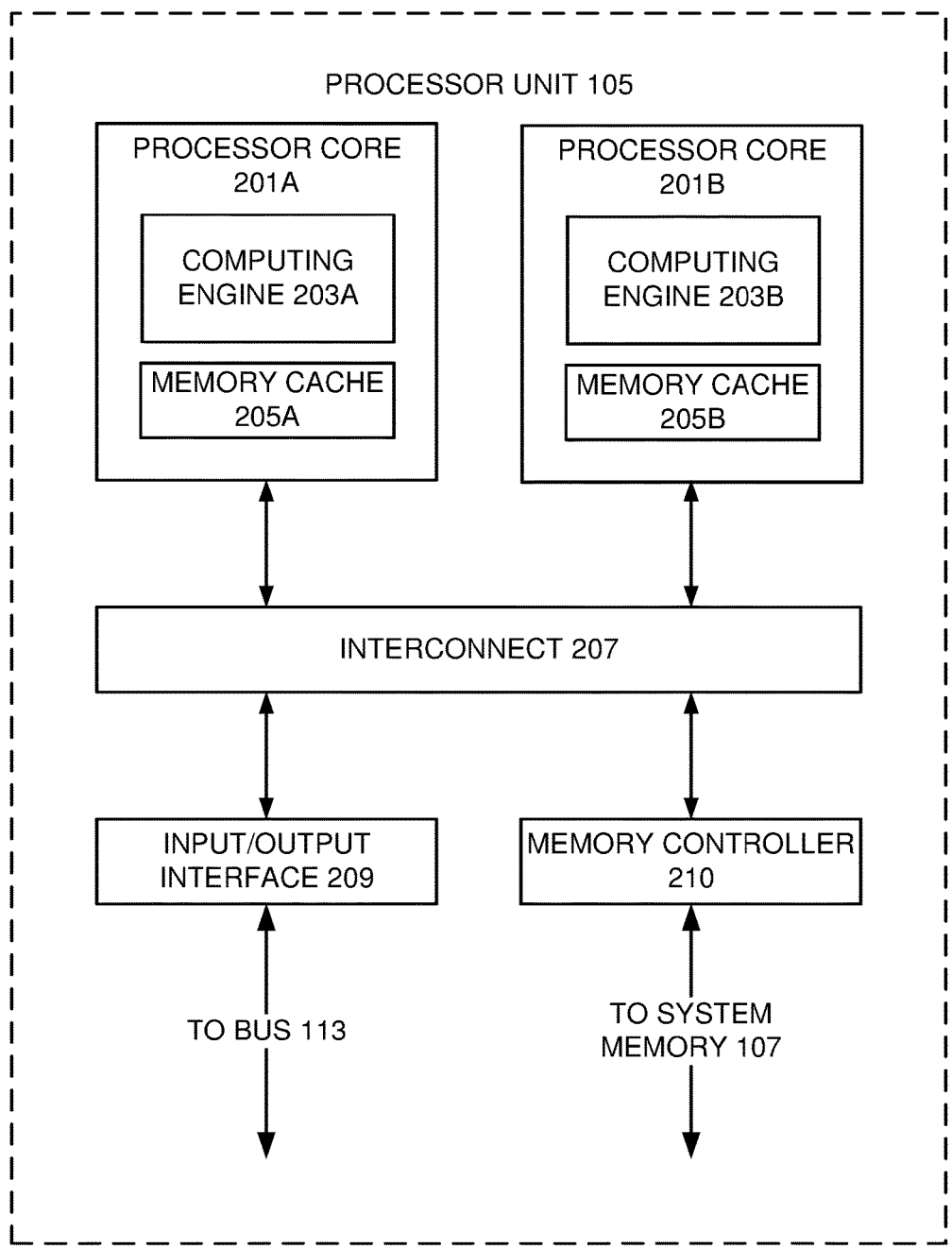

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Schematic Connectivity Representation of Clock Trees with Selective Compaction

Figure 3:
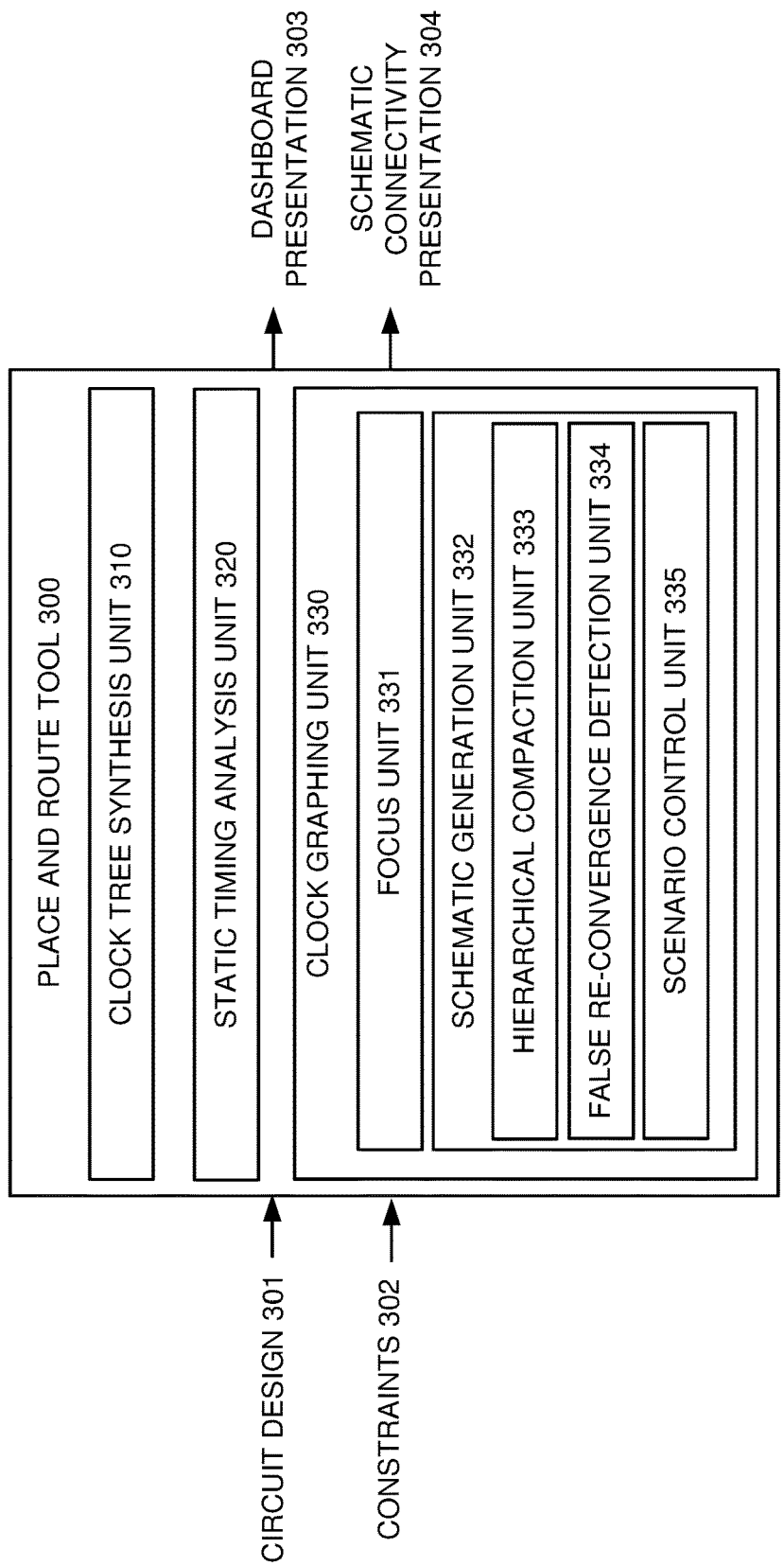
FIG. 3 illustrates an example place and route tool capable of generating schematic connectivity presentation of clock trees with selective compaction according to various embodiments.

FIG. 3 illustrates an example place and route tool 300 capable of generating a schematic connectivity presentation of clock trees with selective compaction according to various embodiments. Referring to FIG. 3, the place and route tool 300 can receive a circuit design 301, such as a netlist, which can model an electronic device at one or more levels of abstraction, such as a gate-level, schematic-level, or transistor-level. The circuit design 301 can describe the electronic device as components, combinational logic, groups of clock-driven circuits, such as hardware registers, flip-flops, or the like, and their associated connectivity.

The place and route tool 300 can receive constraints 302, such as clock tree synthesis constraints, timing constraints, or the like, which can restrict or guide synthesis of at least one clock tree in a physical layout for the circuit design 301. The constraints 302 can include clock propagation delay or clock latency, skew, maximum transition time, maximum capacitance, maximum fan-out, list of buffers and inverters, or the like. As will be discussed below, in some embodiments, the place and route tool 300 can include functionality to capture new constraints or modify one or more of the received constraints 302.

The place and route tool 300 can generate a physical layout for the circuit design 301, which can describe an integrated circuit in terms of planar geometric shapes corresponding to patterns of metal, oxide, or semiconductor layers that make up components of the integrated circuit. There can be many steps in the generation of the physical layout for the circuit design 301, such as partitioning, floor planning, placement, clock tree synthesis, signal routing, or the like. The physical layout for the circuit design 301 can describe the integrated circuit in a GDSII file format, an Open Artwork System Interchange Standard (OASIS) format, Library Exchange Format (LEF), Design Exchange Format (DEF), or the like.

The place and route tool 300 can include a clock tree synthesis unit 310 to perform clock tree synthesis (CTS) to generate one or more clock trees in the physical layout for the circuit design 301 based, at least in part, on a placement of the data path circuitry in the physical layout and the constraints 302. In some embodiments, the place and route tool 300 can place the circuitry for data paths, such as clock-driven circuits, combinational logic, or the like, relative to each other physical layout for the circuit design 301. The placement of the data path circuitry can be based on idealized clock delays identified by the constraints 302.

Each clock tree synthesized by the place and route tool 300 can include a network of clock wiring lines to implement clock signal interconnections or clock signal paths between root clock source devices and the clock-driven circuits of the electronic device. The clock trees can distribute clock signals from root clock source devices to the clock-driven circuits. In some embodiments, each of the root clock source devices can be located in the electronic device and described as a component of the electronic device in the physical layout for the circuit design 301, while in other embodiments, the root clock source devices can provide their respective clock signals to the electronic device through an input/output (I/O) interface or pin.

The clock tree synthesis unit 310, in some embodiments, can generate the clock tree in multiple stages—a first stage to generate an unbalanced clock tree for placement in the design environment and one or more subsequent stages to balance the unbalanced clock tree through the insertion of circuitry, such as buffers, inverters, or the like, in the clock signal paths. While the unbalanced clock tree can provide clock signal paths for the propagation of clock signals to each of the clock-driven circuits, these clock signals arrive at the clock-driven circuits with various amounts of clock skew and slack, for example, due to transmission delays associated with variable distances that the clock signals travel through the unbalanced clock tree to the clock-driven circuits. Clock skew can be a measure of synchronization in clock signal arrival times at different clock-driven circuits. For example, two clock signals that arrive at their respective clock-driven circuits at the different times can be said to have clock skew with a magnitude corresponding to the arrival time difference between the two clock signals at their respective clock-driven circuits. Slack can be a measure of synchronization between clock and data signal arrival times at each of the clock-driven circuits.

The place and route tool 300 may include a static timing analysis unit 320, for example, to analyze timing of the physical layout for the circuit design 301. In some embodiments, the static timing analysis unit 320 can perform a static timing analysis (STA) on the physical layout for the circuit design 301 in various phases of the place-and-route process to determine data arrival timing and clock arrival timing at each of clock-driven circuits in the physical layout for the circuit design 301. The static timing analysis unit 320 may be any type of suitable conventional timing tool, which can perform static timing analysis on the physical layout for the circuit design 301.

In some embodiments, the static timing analysis unit 320 can determine propagation delays in data paths corresponding to combinational logic between the clock-driven circuits. The data arrival timing at the clock-driven circuits can be based, at least in part, on the propagation delays in the data paths between the multiple clock-driven circuits. From this data arrival timing and clock arrival timing, the static timing analysis unit 320 can determine amounts of clock skew and slack, among other metrics, in the physical layout for the circuit design 301. The static timing analysis unit 320 also can determine the data and clock delay in the physical layout for the circuit design 301 for different operating conditions or corners, for example, based on On-Chip Variation (OCV) factors, such a process, voltage, and temperature (PVT) variations.

The place and route tool 300 can include a clock graphing unit 330 to provide a development environment for capturing constraints utilized in clock tree synthesis and for analysis of synthesized clock trees to resolve any timing violations, unsynthesized nets from the circuit design 301, or the like. The clock graphing unit 330 can generate a dashboard presentation 303, which can include clock tree synthesis specifications defining the constraints 302 utilized by the clock tree synthesis unit 310 to generate the clock tree in the physical layout for the circuit design 301. Example embodiments of the dashboard presentation 303 will be described below in FIG. 5.

Figure 5:
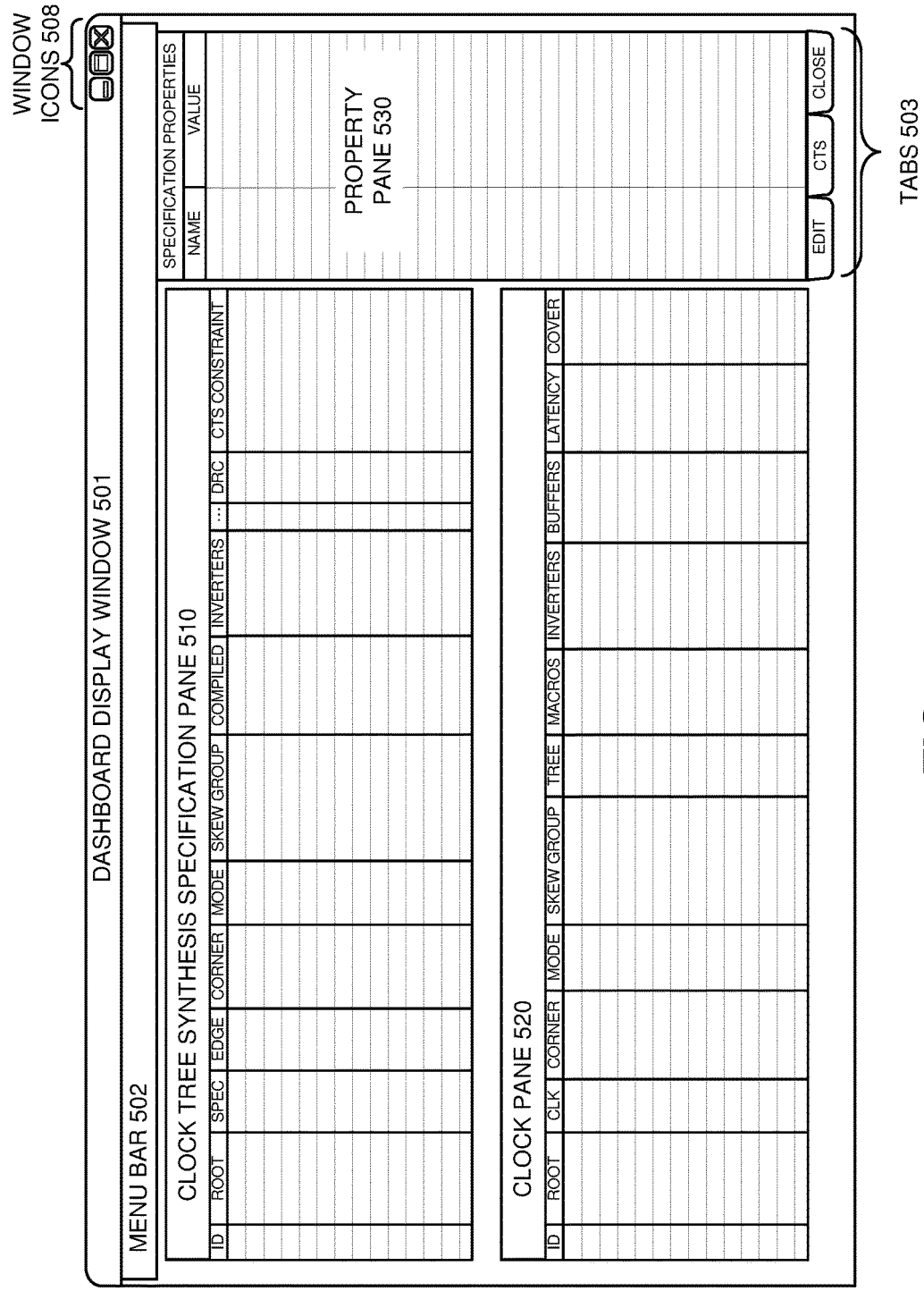
FIG. 5 illustrates an example dashboard display window according to various embodiments.

FIG. 5 illustrates an example dashboard display window 501 according to various embodiments. Referring to FIG. 5, the dashboard display window 501 can include a clock tree synthesis specification pane 510, a clock pane 520, and a property pane 530. The clock tree synthesis specification pane 510 can include a clock specification table having clock tree synthesis specifications defining the constraints 302 utilized to generate a clock tree in a physical circuit design layout.

In some embodiments, the clock specification table can be arranged in a row-column format, with each row corresponding to different type clock tree synthesis specification. The columns in the clock specification table can correspond to the properties or values associated with the clock tree synthesis specifications, and optionally include information corresponding to results of timing-related analysis for the clock tree implementing the clock tree synthesis specifications. For example, the clock specification table can include a compiled column, which can include information correspond to whether a clock tree was synthesized to cover a corresponding clock tree synthesis specification. In another example, the clock specification table can include a design rule check (DRC) column to indicate whether a clock tree synthesized according to the corresponding clock tree synthesis specification satisfied design rules for the clock tree. The clock specification table can include a clock tree synthesis (CTS) constraint column to indicate whether a clock tree synthesized according to the corresponding clock tree synthesis specification satisfied timing constraints.

The clock pane 520 can include a clock table to describe clock signals to be placed and routed in the physical circuit design layout according to the clock tree synthesis specifications. In some embodiments, the clock table can be arranged in rows, with each row corresponding to different type of clock signals to be synthesized in the physical circuit design layout. Each of the clock signals in the clock table can be selectable, for example, in response to user input, which can add constraints to the clock specification table by modifying or adding a clock tree synthesis specification. This modification or addition of the clock tree synthesis specification can allow subsequent utilization of the clock tree synthesis specification in the generation of a clock tree that implements the clock signal from the clock table. In other words, the dashboard display window 501 can allow provide an interactive development environment for the generation or modification of clock tree synthesis specifications based on clock signals to be synthesized.

The property pane 530 can be populated with properties of the clock tree synthesis specifications and their associated values. In some embodiments, when a clock tree synthesis specification is selected in the clock specification table, the properties associated with the selected clock tree synthesis specification can be populated into the property pane.

The dashboard display window 501 can include tabs 503 that, when selected, can initiate various functionality in the dashboard display window 501. For example, the tabs 503 can include an edit tab that, when selected, can allow for editing of the clock tree synthesis specifications in the clock tree synthesis specification pane 510. In some embodiments, the clock tree synthesis specifications in the clock tree synthesis specification pane 510 can be edited by an addition or modification of a clock tree synthesis specification in the clock tree synthesis specification pane 510, for example, by selecting a clock described in the clock table to be included in a clock tree synthesis specification or by modification of one or more specification properties in the property pane 530. The tabs 503 also can include a CTS tab that, when selected, can prompt performance of clock tree synthesis in a physical layout based on the clock tree synthesis specifications in the clock tree synthesis specification pane 510. The tabs 503 also can include a close tab, which can close the dashboard display window 501, for example, to return to a display window having a representation of the physical circuit design layout, or the like.

The clock tree synthesis specification pane 510, the clock pane 520, and the property pane 530 can be interrelated, with a selection of a row in one pane causing corresponding portions of the other panes to automatically scroll into view, be populated with values, and optionally be highlighted or otherwise have their presentation altered to annunciate their presence in the corresponding panes. For example, a selection of a row in the clock tree synthesis specification pane 510 can cause the property pane 530 to be populated with values associated with a clock tree synthesis specification corresponding to the selected row. In some embodiments, operations in the dashboard display window 501 can be coordinated with a display window having a representation of the physical circuit design layout. For example, a selection of a row in the clock tree synthesis specification pane 510 of the dashboard display window 501 can prompt a portion of a clock tree implementing the clock tree synthesis specification associated with the selected row to be highlighted or otherwise have its presentation altered in the representation of the physical circuit design layout.

The dashboard display window 501 can include a menu bar 502 having various mechanisms to selectively sort, filter, organize, populate, find, or the like, the clock tree synthesis specification pane 510, the clock pane 520, and the property pane 530. In some embodiments, the menu bar 502 can include a schematic icon for generating a schematic connectivity presentation for one or more of the clock tree synthesis specifications. The dashboard display window 501 also can include window icons 508, which can control sizing of the dashboard display window 501, such as enlarging, shrinking, minimizing, or the like, and closing of the dashboard display window 501.

Referring back to FIG. 3, the clock graphing unit 330 can include a focus unit 331 to select a portion of the clock tree to present in a schematic connectivity presentation 304. In some embodiments, the focus unit 331 can identify a clock tree synthesis specification to analyze, for example, in response to user input, and determine which clock tree was synthesized based on the identified clock tree synthesis specification. The focus unit 331 also can analyze the identified clock tree synthesis specification to detect one or more timing violations in the corresponding clock tree synthesized based on the identified clock tree synthesis specification, and select the portion of the clock tree based on the detected timing violation. For example, when the clock tree synthesis specification includes clock skew that exceeds a timing requirement for the electronic device described in the circuit design 301, the focus unit 331 can identify the circuitry in the clock tree having the clock skew associated with the timing violation. In another example, when the clock tree synthesis specification includes a maximum latency or minimum latency timing violation, the focus unit 331 can identify the circuit components in the clock tree corresponding to a maximum latency or a minimum latency.

The clock graphing unit 330 can include a schematic generation unit 332 to generate the schematic connectivity presentation 304 of the clock tree based, at least in part, on the selected portion of the clock tree. Since many clock trees include thousands of circuit elements, the schematic generation unit 332 can include the circuitry corresponding to the selected portion of the clock tree in the schematic connectivity presentation 304, while compressing other portions of the clock tree into packets or bundles. The schematic connectivity presentation 304 of the clock tree can be focused to show the details of the selected portion of the clock tree and have the other portions of the clock tree.

The schematic generation unit 332 can include a hierarchical compaction unit 333 to perform the compression or compaction of the non-selected or other portions of the clock tree. Since clock trees can have a hierarchical structure and connectivity, the hierarchical compaction unit 333 can generate a compacted version of the non-selected or other portions of the clock tree that retains the hierarchy of the clock tree. The compacted packets or bundles in the schematic connectivity presentation 304 of the clock tree, while appearing as a single block representing multiple circuit elements in the clock tree, can have an internal structure corresponding to the original hierarchy of the clock tree. By presenting the circuitry corresponding to the selected portions of the clock tree and compacting the other portions, the schematic connectivity presentation 304 can focus on presenting circuitry corresponding to a timing violation.

In some embodiments, the clock graphing unit 330 can selectively expand one or more of the compacted packets or bundles in the schematic connectivity presentation 304 of the clock tree, for example, based on user input. The clock graphing unit 330 can identify one or more circuits within the compacted packets or bundles to extract, decompress the compacted packets or bundles according to the retained hierarchy of the packets or bundles, extract the identified circuits for presentation with the other selected portions in the clock tree, and re-compress the non-extracted portions of the packets or bundles for inclusion in the schematic connectivity presentation 304 of the clock tree. For example, when the clock graphing unit 330 is directed to present a direct fan-in circuit of a leaf node of the clock tree, the clock graphing unit 330 can decompress a compacted packet or bundle that fans into the leaf node based on the retained hierarchy, identify the direct fan-in circuit from the decompressed packet or bundle, and re-compress the packet or bundle without the direct fan-in circuit. The clock graphing unit 330 can modify the schematic connectivity presentation 304 of the clock tree to include the selected portion of the clock tree, the direct fan-in circuit, and the re-compressed packet or bundle.

The schematic generation unit 332 can include a false re-convergence detection unit 334 to analyze connectivity of clock tree circuitry to be presented in the schematic connectivity presentation 304 of the clock tree outside of compressed packets or bundles, and detect any re-convergence in the connectivity of clock tree circuitry. In some embodiments, re-convergence in a clock tree can correspond to a clock tree network that, at one clock tree node, diverges or fans-out into multiple paths and then, at another clock tree node, the paths re-converge. The false re-convergence detection unit 334 can analyze the detected re-convergence to determine whether the clock signals remain isolated from each other. For example, when the re-convergence occurs at a multiplexer circuit in the clock tree, the clock signals may remain isolated from each other, which can indicate that the re-convergence is a false re-convergence. The false re-convergence detection unit 334 may selectively remove or modify the connectivity of the clock tree circuitry in the schematic connectivity presentation 304 of the clock tree to eliminate re-convergences that the false re-convergence detection unit 334 determined to be false.

The schematic generation unit 332 can generate the schematic connectivity presentation 304 of the clock tree to include multiple different clock signal propagation scenarios, which, in some embodiments, can be presented concurrently. Each clock signal propagation scenario can include a clock signal, a clock signal transition edge, a corner, and an operational mode. The clock signal in the clock signal propagation scenario can describe one of the clock signals in the circuit design 301. The clock signal transition edge in the clock signal propagation scenario can describe which transition in the clock signal, such as a rising edge or a falling edge, triggers the clock-driven circuitry in the physical layout of the circuit design 301. The corner in the clock signal propagation scenario can describe a set of operating conditions, which can be based on On-Chip Variation (OCV) factors, such a process, voltage, and temperature (PVT) variations. Each of the PVT variations can increase or decrease clock signal propagation delay depending on their values. The operational mode in the clock signal propagation scenario can characterize a use model for the electronic device described in the circuit design 301, such as functional modes, power modes, or the like, in which various portions of the electronic device are operational.

The schematic generation unit 332 can include a scenario control unit 335 to identify one or more of the clock signal propagation scenarios that correspond to the selected portions of the clock tree included in the schematic connectivity presentation 304 of the clock tree. The scenario control unit 335 can prompt the schematic generation unit 332 to include circuitry and/or connectivity in the schematic connectivity presentation 304 of the clock tree, which presents a plurality of the clock signal propagation scenarios concurrently. Embodiments of the scenario control will be described below in FIG. 6 in greater detail.

Figure 4:
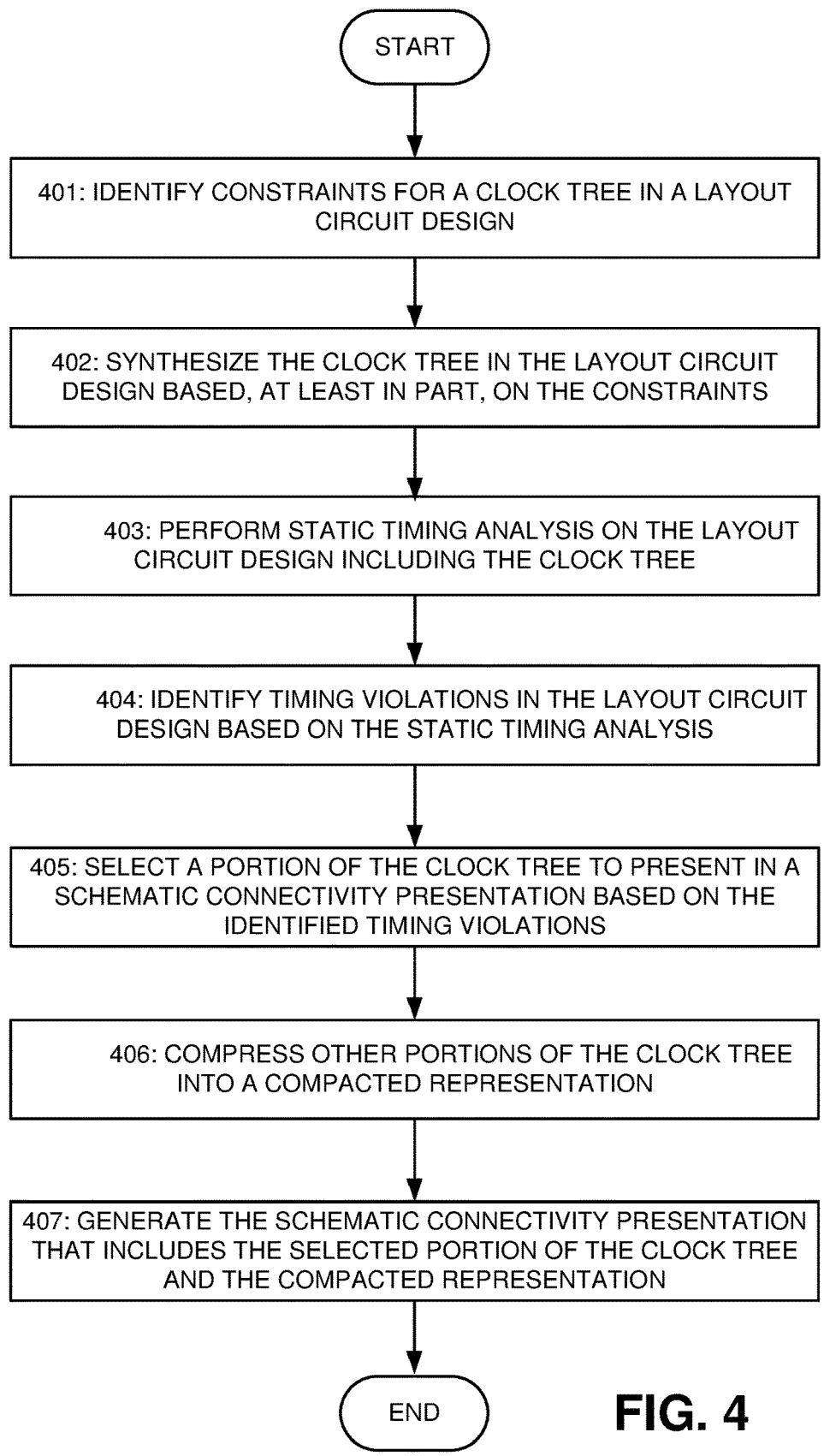
FIG. 4 illustrates an example flowchart showing selective compaction in a schematic connectivity presentation of clock trees according to various examples.

FIG. 4 illustrates an example flowchart showing selective compaction schematic connectivity presentation of clock trees according to various examples. Referring to FIG. 4, in a block 401, a computing system implementing a place and route tool can identify constraints for a clock tree in a layout circuit design. In some embodiments, the constraints can include clock tree synthesis constraints, timing constraints, or the like, which the computing system can receive from an external source. The computing system also can present a dashboard presentation configured to present clocks to be synthesized and the clock specification having the constraints to be utilize to generate the clock tree. The computing system can capture constraints, for example, in response to user input, and modify one or more of the clock specifications based on the captured constraints.

In a block 402, the computing system implementing the place and route tool can synthesize the clock tree in the layout circuit design based, at least in part, on the constraints. The computing system can perform clock tree synthesis (CTS) to generate the clock tree in the layout circuit design based, at least in part, on a placement of the data path circuitry in the layout circuit design and the clock specifications that define the constraints. In some embodiments, the clock tree synthesis can insert a network of clock wiring lines to implement clock signal interconnections or clock signal paths between root clock source devices and the clock-driven circuits in the layout circuit design and insert circuitry, such as buffers, inverters, or the like, in the clock signal paths to balance delays associated with the propagation of the clock signal through the clock tree.

In a block 403, the computing system can implement a static timing analysis engine to perform static timing analysis on the layout circuit design including the clock tree. The computing system can determine data arrival timing and clock arrival timing at each of clock-driven circuits in the layout circuit design. The static timing analysis engine also can determine the data and clock delay in the layout circuit design for different operating conditions or corners, for example, based on On-Chip Variation (OCV) factors, such a process, voltage, and temperature (PVT) variations. The static timing analysis engine may be any type of suitable conventional timing tool, which can perform static timing analysis on the layout circuit design.

In a block 404, the computing system implementing the place and route tool can identify timing violations in the layout circuit design based on the static timing analysis. The computing system can determine whether the results of the static timing analysis conform to a set of timing requirements for an electronic device described by the layout circuit design or the constraints in the clock specifications. When the results do not conform with the timing requirements or constraints, the computing system can identify the non-conformance as a timing violation. In some embodiments, the computing system can indicate a presence of the timing violation in the dash board presentation for the clock tree or in a schematic connectivity presentation.

In a block 405, the computing system implementing the place and route tool can select a portion of the clock tree to present in a schematic connectivity presentation based on the identified timing violations. The computing system can identify a clock specification to analyze, for example, in response to user input, and identify the clock tree was synthesized based on the identified clock specification. The computing system can analyze the identified clock specification to detect one or more timing violations in the corresponding clock tree synthesized based on the identified clock specification, and select the portion of the clock tree based on the detected timing violation. For example, when the clock specification includes clock skew that exceeds a timing requirement for the electronic device described in the circuit design, the computing system can identify the circuitry in the clock tree having the clock skew associated with the timing violation. In another example, when the clock specification includes a maximum latency or minimum latency timing violation, the computing system can identify the circuit components in the clock tree corresponding to a maximum latency or a minimum latency.

In some embodiments, the computing system also can identify and remove false re-convergences from the selected portion of the clock tree. The computing system can identify any re-convergence in the connectivity of selected portions of the clock tree, and analyze them to detect re-convergences where the clock signals remain isolated from each other. The computing system may selectively remove or modify the connectivity of the selected portion of the clock tree in the schematic connectivity presentation to eliminate re-convergences where the clock signals remain isolated from each other.

In a block 406, the computing system implementing the place and route tool can compress other portions of the clock tree into a compacted representation. The computing system can compress the other portions of the clock tree into bundles or packets, which can correspond to the compacted representation of the other portions of the clock tree. For example, the computing system can take thousands of clock tree circuits and represent them with a single packet or bundle, which can to the compacted representation. Since the clock tree can have a hierarchical structure and connectivity, the computing system can generate the compacted representation so that has an internal representation that retains the hierarchy of the other portions of the clock tree.

In a block 407, the computing system implementing the place and route tool can generate the schematic connectivity presentation that includes the selected portion of the clock tree and the compacted representation. By presenting the circuitry corresponding to the selected portions of the clock tree and compacting the other portions, the computing system can focus on presenting circuitry corresponding to a timing violation. The computing system also can generate the schematic connectivity presentation to show the clock tree in multiple different scenarios concurrently.

Figure 6:
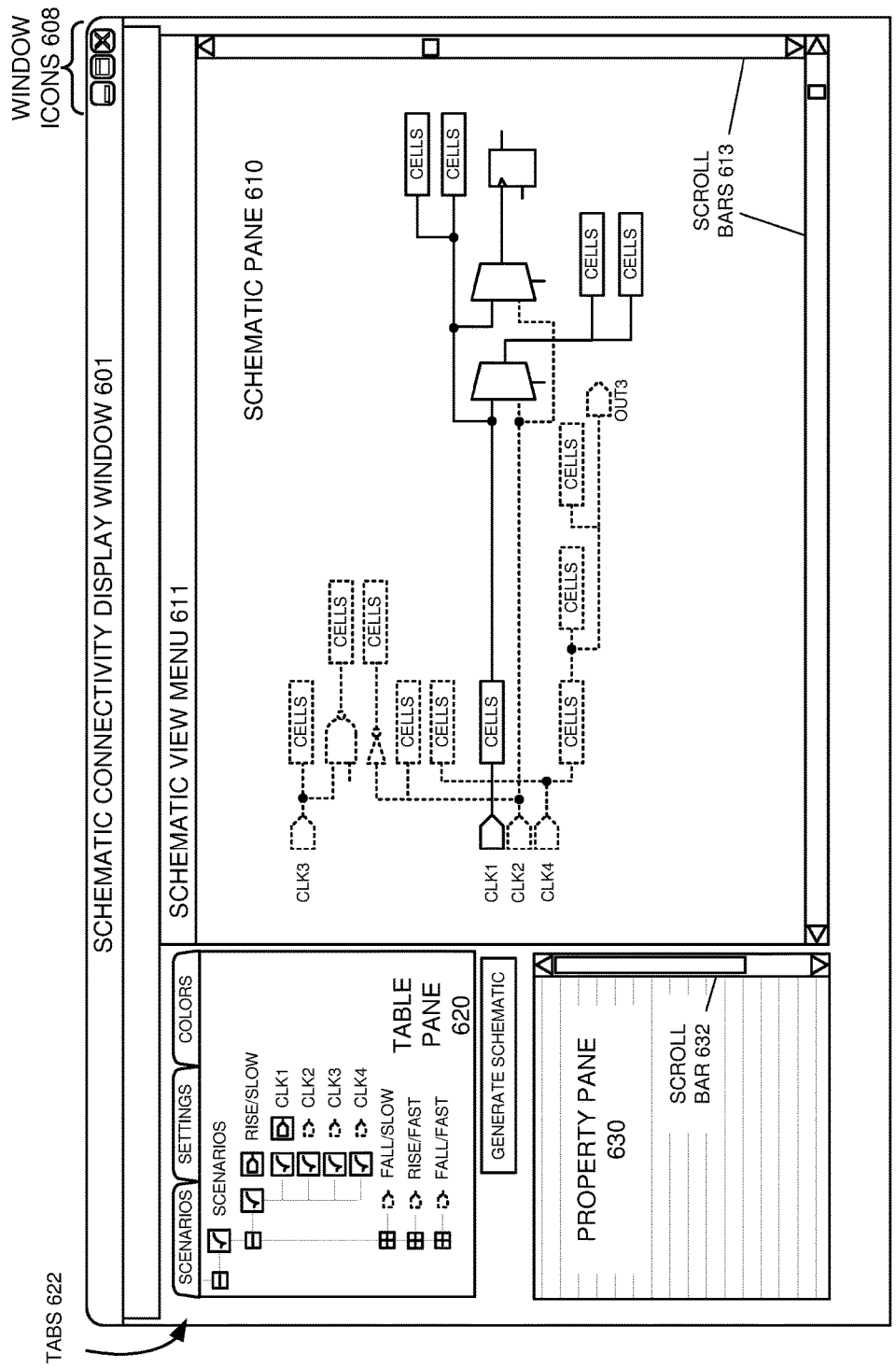
FIG. 6 illustrates an example schematic connectivity display window according to various embodiments.

FIG. 6 illustrates an example schematic connectivity display window 601 according to various embodiments. Referring to FIG. 6, the schematic connectivity display window 601 can include a schematic pane 610, a table pane 620, and a property pane 630. The schematic pane 610 can include a presentation of a clock tree schematic with selective compaction. The clock tree schematic can display one or more clock tree circuits, for example, circuitry a place-and-route tool determined were related of a timing violation. The clock tree schematic also can display one or more compacted representations of clock tree circuits, for example, listed as cells in FIG. 6. These compacted representations can represent multiple different clock tree circuits in the clock tree, which have been compressed to ease review of the other clock tree circuits in the clock tree schematic. The schematic pane 610 can include scroll bars 613 that, when selected or moved, for example, in response to user input, can adjust which portions of the selectively compacted clock tree schematic are viewable in the source pane 610.

The clock tree schematic can represent multiple scenarios concurrently, for example, with clock tree circuitry and connectivity corresponding to a primary scenario represented with solid lines and clock tree circuitry and connectivity corresponding to one or more non-primary scenarios represented with dashed lines. The clock tree circuitry, the compacted representations, and the connectivity also can be accentuated, for example, by color or textures, based on various properties of the clock tree. For example, the clock tree schematic can have excluded clock tree circuitry, such as pins, leaves, cells, or the like, represented with a particular color. The excluded clock tree circuitry can correspond to cells or circuits that have been identified as not being included in clock skew calculations, not being delay balanced, not utilizing a synchronous clock signal, or the like. In another example, the clock tree schematic can include clock tree circuitry that does not correspond to any selected scenario, but may couple to clock tree circuitry within a selected scenario. The clock tree schematic can utilize a different color or texture to represent these types of clock tree circuits.

The clock tree circuitry, the compacted representations, and the connectivity in the clock tree schematic can be selectable in the schematic pane 610. For example, the compacted representations can be selectable for expansion or contraction, which can alter the clock tree circuitry exposed in the clock tree schematic. As discussed above, since the compacted representations can retain the hierarchy of the clock tree portions they represent, a selection for expansion of contraction can be performed by decompressing the compacted representation, altering the decompress clock tree circuitry to extract or add clock tree circuitry, and then recompress the altered clock tree circuitry into a new compacted representation. The clock tree circuitry in the clock tree schematic can be selectable to identify properties of the clock tree circuitry or its associated timing, for example, in the property pane 630, to prompt an expansion or contraction of a compacted representation coupled to the clock tree circuitry, to modify constraints or a clock specification corresponding to the clock tree circuitry, or the like.

The table pane 620 can include selectable customizations for the schematic pane 610. For example, the schematic connectivity display window 601 can include tabs 622 that, when selected, can initiate various functionality in the table pane 620. For example, the tabs 622 can include a scenarios tab that, when selected, can allow for selection of different scenarios in the clock tree schematic. The tabs 622 also can include a settings tab that, when selected, can provide a list of optional settings for the presentation of the clock tree schematic in the schematic pane 610. The tabs 622 also can include a colors tab that, when selected, can provide a list of color options for the presentation of the clock tree schematic in the schematic pane 610.

When the scenario tab have been selected, as shown in FIG. 6, the table pane 620 can include a plurality of selectable clock signal propagation scenarios. Each clock signal propagation scenario can include a clock signal, a clock signal transition edge, a corner, and an operational mode. The clock signal in the clock signal propagation scenario can describe one of the clock signals in the circuit design. The clock signal transition edge in the clock signal propagation scenario can describe which transition in the clock signal, such as a rising edge or a falling edge, triggers the clock-driven circuitry in the physical layout of the circuit design. The corner in the clock signal propagation scenario can describe a set of operating conditions, which can be based on On-Chip Variation (OCV) factors, such a process, voltage, and temperature (PVT) variations. Each of the PVT variations can increase or decrease clock signal propagation delay depending on their values. The operational mode in the clock signal propagation scenario can characterize a use model for the electronic device described in the circuit design, such as functional modes, power modes, or the like, in which various portions of the electronic device are operational. The selection of different scenarios in the table pane 620 can prompt modification of the clock tree schematic in the schematic pane 610 to represent selected scenarios concurrently, for example, with clock tree circuitry and connectivity corresponding to a primary scenario represented with solid lines and clock tree circuitry and connectivity corresponding to one or more non-primary scenarios represented with dashed lines.

The property pane 630 can be populated with description of properties for the selectively compacted clock tree schematic. In some embodiments, when a portion of the properties is selected in the schematic pane 610, the properties associated with the selected portion of the clock tree can be populated into the property pane 630. The property pane 630 can include scroll bars 632 that, when selected or moved, for example, in response to user input, can adjust which property descriptions are viewable in the property pane 630.

The schematic pane 610, the table pane 620, and the property pane 630 can be interrelated, with a selection in one pane causing corresponding portions of the other panes to automatically populate with values or schematic presentations, become highlighted or otherwise have their presentation altered to annunciate their presence in the corresponding panes. For example, a selection of one or more scenarios in the table pane 620 can cause the schematic pane 610 to be populated with representations of circuitry and associated connectivity corresponding to the selected scenarios. The selection of one or more scenarios in the table pane 620 also can cause the property pane 630 to be populated with values associated with a selected portion of the clock tree associated with the selected scenarios.

In some embodiments, operations in the schematic connectivity window 601 can be coordinated with a display window having a representation of the layout circuit design. For example, a selection of a circuit representation in the schematic pane 610 of the schematic connectivity window 601 can prompt a portion of a clock tree to be highlighted or otherwise have its presentation altered in the representation of the layout circuit design. The schematic connectivity window 601 also can include window icons 608, which can control sizing of the schematic connectivity window 601, such as enlarging, shrinking, minimizing, or the like, and closing of the schematic connectivity window 601.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

Conclusion

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   synthesizing, by a computing system, a clock tree in a layout design of an integrated circuit based, at least in part, on timing constraints for the integrated circuit;
   selecting, by the computing system, a portion of the clock tree to present in a schematic connectivity presentation;
   generating, by the computing system, the schematic connectivity presentation of the clock tree that includes the selected portion of the clock tree, which is coupled to at least one compacted representation of other portions of the clock tree in the schematic connectivity presentation of the clock tree;

extracting, by the computing system, one or more clock tree circuits from the compacted representation based, at least in part, on a retained hierarchical connectivity of the other portions of the clock tree in the compacted representation; and modifying, by the computing system, the schematic connectivity presentation of the clock tree to include the extracted clock tree circuits coupled to a modified-version of the compacted representation that excludes the extracted clock tree circuits.

2. The method of claim 1, further comprising prompting, by the computing system, presentation of the schematic connectivity presentation of the clock tree on a display device.

3. The method of claim 1, further comprising compressing, by the computing system, the other portions of the clock tree into the compacted representation based on the selection of the portion of the clock tree to present in the schematic connectivity presentation.

4. The method of claim 3, wherein compressing the other portions of the clock tree into the compacted representation retains the hierarchical connectivity of the other portions of the clock tree.

5. The method of claim 1, wherein extracting the clock tree circuits from the compacted representation further comprises removing false re-convergence of the extracted clock tree circuits in the clock tree.

6. The method of claim 1, wherein selecting the portion of the clock tree to present in the schematic connectivity presentation is based, at least in part, on a conformance of the portion of the clock tree to the timing constraints for the clock tree.

7. A system comprising:
a memory device configured to store machine-readable instructions; and
a computing system including one or more processing devices, in response to executing the machine-readable instructions, configured to:
synthesize a clock tree in a layout design of an integrated circuit based, at least in part, on timing constraints for the integrated circuit;
select a portion of the clock tree to present in a schematic connectivity presentation;
generate the schematic connectivity presentation of the clock tree that includes the selected portion of the clock tree, which is coupled to at least one compacted representation of other portions of the clock tree in the schematic connectivity presentation of the clock tree;
extract one or more clock tree circuits from the compacted representation based, at least in part, on a retained hierarchical connectivity of the other portions of the clock tree in the compacted representation; and
modify the schematic connectivity presentation of the clock tree to include the extracted clock tree circuits coupled to a modified-version of the compacted representation that excludes the extracted clock tree circuits.

8. The system of claim 7, wherein the one or more processing devices, in response to executing the machine-readable instructions, are configured to compress the other portions of the clock tree into the compacted representation based on the selection of the portion of the clock tree to present in the schematic connectivity presentation.

9. The system of claim 8, wherein the compression of the other portions of the clock tree into the compacted representation retains the hierarchical connectivity of the other portions of the clock tree.

10. The system of claim 7, wherein the extraction of the clock tree circuits from the compacted representation removes false re-convergence of the extracted clock tree circuits in the clock tree.

11. The system of claim 7, wherein the selection of the portion of the clock tree to present in the schematic connectivity presentation is based, at least in part, on a conformance of the portion of the clock tree to the timing constraints for the clock tree.

12. An apparatus including a memory device storing instructions configured to cause one or more processing devices to perform operations comprising:
synthesizing a clock tree in a layout design of an integrated circuit based, at least in part, on timing constraints for the integrated circuit;
selecting a portion of the clock tree to present in a schematic connectivity presentation;
generating the schematic connectivity presentation of the clock tree that includes the selected portion of the clock tree, which is coupled to at least one compacted representation of other portions of the clock tree in the schematic connectivity presentation of the clock tree;
extracting one or more clock tree circuits from the compacted representation based, at least in part, on a retained hierarchical connectivity of the other portions of the clock tree in the compacted representation; and
modifying the schematic connectivity presentation of the clock tree to include the extracted clock tree circuits coupled to a modified-version of the compacted representation that excludes the extracted clock tree circuits.

13. The apparatus of claim 12, wherein the instructions are configured to cause one or more processing devices to perform operations further comprising prompting presentation of the schematic connectivity presentation of the clock tree on a display device.

14. The apparatus of claim 12, wherein the instructions are configured to cause one or more processing devices to perform operations further comprising compressing the other portions of the clock tree into the compacted representation based on the selection of the portion of the clock tree to present in the schematic connectivity presentation.

15. The apparatus of claim 14, wherein compressing the other portions of the clock tree into the compacted representation retains the hierarchical connectivity of the other portions of the clock tree.

16. The apparatus of claim 12, wherein extracting the clock tree circuits from the compacted representation further comprises removing false re-convergence of the extracted clock tree circuits in the clock tree.

17. The apparatus of claim 12, wherein selecting the portion of the clock tree to present in the schematic connectivity presentation is based, at least in part, on a conformance of the portion of the clock tree to the timing constraints for the clock tree.

* * * * *